(12) United States Patent
Lu et al.

(10) Patent No.: US 9,806,045 B2
(45) Date of Patent: Oct. 31, 2017

(54) INTERCONNECTION STRUCTURE INCLUDING A METAL POST ENCAPSULATED BY SOLDER JOINT HAVING A CONCAVE OUTER SURFACE

(71) Applicant: TAIWAN SEMICONDUCTOR MANUFACTURING COMPANY LTD., Hsinchu (TW)

(72) Inventors: Chun-Lin Lu, Hsinchu (TW); Kai-Chiang Wu, Hsinchu (TW); Ming-Kai Liu, New Taipei (TW); Yen-Ping Wang, Changhua County (TW); Shih-Wei Liang, Taichung County (TW); Ching-Feng Yang, Taipei (TW); Chia-Chun Miao, Hsinchu County (TW); Hao-Yi Tsai, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 14/014,051

(22) Filed: Aug. 29, 2013

(65) Prior Publication Data
US 2015/0061116 A1 Mar. 5, 2015

(51) Int. Cl.
*H01L 23/00* (2006.01)
*H01L 23/498* (2006.01)

(52) U.S. Cl.
CPC ........ *H01L 24/13* (2013.01); *H01L 23/49811* (2013.01); *H01L 24/05* (2013.01); *H01L 24/06* (2013.01); *H01L 24/14* (2013.01); *H01L 24/03* (2013.01); *H01L 24/11* (2013.01); *H01L 24/81* (2013.01); *H01L 2224/0345* (2013.01); *H01L 2224/03462* (2013.01); *H01L 2224/0401* (2013.01); *H01L 2224/05552* (2013.01); *H01L 2224/05555* (2013.01); *H01L 2224/05568* (2013.01); *H01L 2224/05569* (2013.01); *H01L 2224/05573* (2013.01); *H01L 2224/05644* (2013.01); *H01L 2224/05647* (2013.01); *H01L 2224/05666* (2013.01); *H01L 2224/05671* (2013.01); *H01L 2224/05684* (2013.01); *H01L 2224/06051* (2013.01); *H01L 2224/1134* (2013.01); *H01L 2224/13012* (2013.01); *H01L 2224/13026* (2013.01); *H01L 2224/1357* (2013.01); *H01L 2224/13124* (2013.01);
(Continued)

(58) Field of Classification Search
CPC ................................ H01L 23/00; H01L 24/00
USPC ........................................... 257/737; 438/124
See application file for complete search history.

(56) References Cited

U.S. PATENT DOCUMENTS

| 5,147,084 A * | 9/1992 | Behun ..................... G01R 31/04 |
| | | 174/259 |
| 5,154,341 A * | 10/1992 | Melton ............. H01L 23/49827 |
| | | 228/180.22 |
| 5,640,052 A * | 6/1997 | Tsukamoto .................... 257/781 |
| 5,872,404 A * | 2/1999 | Lynch et al. .................. 257/781 |
| 6,249,051 B1 * | 6/2001 | Chang ..................... H01L 24/10 |
| | | 257/737 |

(Continued)

*Primary Examiner* — Marc Armand
*Assistant Examiner* — Younes Boulghassoul
(74) *Attorney, Agent, or Firm* — WPAT, P.C., Intellectual Property Attorneys; Anthony King

(57) ABSTRACT

A semiconductor device includes a carrier, an under bump metallurgy (UBM) pad on the carrier, and a post on a surface of the UBM pad. In some embodiments, a height of the post to a longest length of the UBM pad is between about 0.25 and about 0.7. A method of manufacturing a semiconductor device includes providing a carrier, disposing a UBM pad on the carrier and forming a post on the UBM pad.

20 Claims, 11 Drawing Sheets

(52) U.S. Cl.
CPC ........... *H01L 2224/13144* (2013.01); *H01L 2224/13147* (2013.01); *H01L 2224/13155* (2013.01); *H01L 2224/13166* (2013.01); *H01L 2224/13169* (2013.01); *H01L 2224/13551* (2013.01); *H01L 2224/13562* (2013.01); *H01L 2224/13565* (2013.01); *H01L 2224/13611* (2013.01); *H01L 2224/13616* (2013.01); *H01L 2224/14051* (2013.01); *H01L 2224/16058* (2013.01); *H01L 2224/81191* (2013.01); *H01L 2224/81411* (2013.01); *H01L 2224/81416* (2013.01); *H01L 2224/81444* (2013.01); *H01L 2224/81447* (2013.01); *H01L 2224/81455* (2013.01); *H01L 2224/81815* (2013.01); *H01L 2924/01322* (2013.01); *H01L 2924/3512* (2013.01)

(56) References Cited

U.S. PATENT DOCUMENTS

| | | | |
|---|---|---|---|
| 2001/0048158 A1* | 12/2001 | Lin | B23K 3/0607 257/737 |
| 2005/0127508 A1* | 6/2005 | Lee | H01L 24/11 257/737 |
| 2006/0055032 A1* | 3/2006 | Chang | H01L 21/4853 257/734 |
| 2007/0269928 A1* | 11/2007 | Farooq | B23K 3/0623 438/108 |
| 2008/0122117 A1* | 5/2008 | Pendse | 257/778 |
| 2009/0045524 A1* | 2/2009 | Mohammed | H01L 23/13 257/777 |
| 2012/0252168 A1* | 10/2012 | Nah et al. | 438/124 |
| 2014/0057392 A1* | 2/2014 | Nah et al. | 438/108 |

* cited by examiner

INTERCONNECTION STRUCTURE INCLUDING A METAL POST ENCAPSULATED BY SOLDER JOINT HAVING A CONCAVE OUTER SURFACE

FIELD

The disclosure relates to a semiconductor device, and more particularly to a semiconductor package and methods of manufacturing the semiconductor package.

BACKGROUND

The demand for ever higher circuit board density has resulted in small size semiconductors devices having a low profile. With the improvements on the packaging technology, methodology such as surface mounting technology (SMT) becomes popular for manufacturing a miniaturized semiconductor package. In the SMT, a carrier mounts and electrically connects with another carrier by various manner. For example, the carrier is mounted on a surface of another carrier through a number of solder balls. The solder balls dispose respectively on a number of pads of the carrier, then the solder balls dispose on corresponding pads on the surface of another carrier. The solder balls bond the pads of the carrier and the pads of another carrier by a heat treatment to form solder bumps, so that the carrier electrically connects and integrates with another carrier.

By bonding the carrier on another carrier through disposition of the solder bumps between the pads of the carrier and the pads of another carrier, an electrical resistance and a required space for occupying components and circuits are both reduced. However, a reliability of the solder bumps affects a manufacturing yield of the semiconductor package. A failure on a single solder bump causes a fatal malfunction of the semiconductor package. Different attempts have been made to improve a structure of the semiconductor package and a method for manufacturing the semiconductor package. Such improvements however each have their own deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
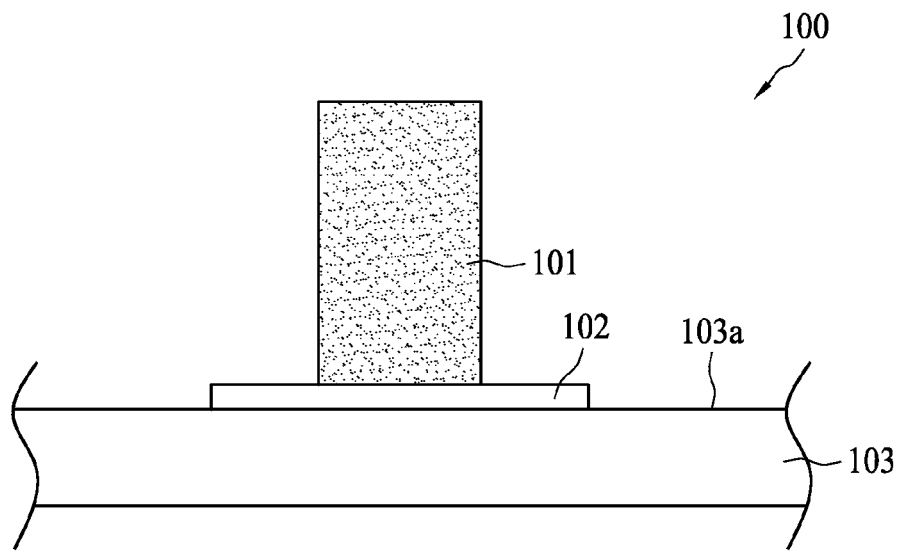
FIG. 1 is a schematic view of a semiconductor device including a post on a pad of a carrier in accordance with some embodiments of the present disclosure.

A carrier mounts and electrically connects with another carrier by a number of solder bumps. High stress inside the solder bumps causes the solder bumps to be vulnerable and a crack on a surface of the solder bump. The crack can propagate through the solder bumps during subsequent operations to further weaken the solder bumps and the electrical connection between the pads of the carrier and the pads of another carrier, and ultimately result in a failure of the semiconductor device.

In the present disclosure, a semiconductor device with a structure for minimizing the stress and preventing the crack is disclosed. The semiconductor device has a post on an under bump metallurgy (UBM) pad of a carrier. The post facilitates formation of a wetting angle between the UBM pad and an outer surface of the solder bump to minimize the stress at a corner of the solder bump and thus prevent formation of the crack. In addition, the post is disposed within the solder bump in order to prevent any crack propagating through the solder bump.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

FIG. 1 is an embodiment of a semiconductor device 100. The semiconductor device 100 includes a carrier 103, a pad 102 on the carrier 103, and a post 101 on the pad 102. In some embodiments, the carrier 103 is a substrate used as a base for carrying and supporting components or circuits. In some embodiments, the carrier 103 is a silicon wafer which would be fabricated to become integrated circuits (IC) in subsequent manufacturing operations. In some embodiments, the carrier 103 is a circuit board including some circuits for electrical connection of components thereon. In some embodiments, the circuit board is a printed circuit board (PCB).

Figure 1A:
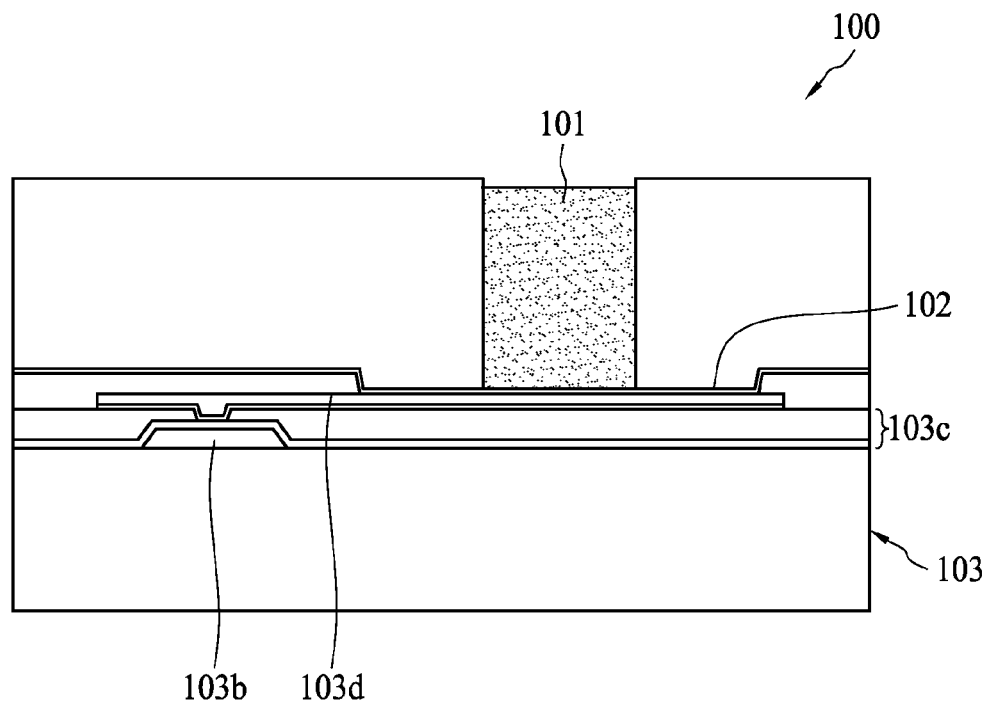
FIG. 1A is a schematic view of a semiconductor device including an under bump metallurgy (UBM) pad on a surface of a carrier and a post on the UBM pad in accordance with some embodiments of the present disclosure.

Referring to FIG. 1, the pad 102 is disposed and attached on a surface 103a of the carrier 103. The pad 102 is electrically conductive and designed to electrically communicate with circuits of the carrier 103. FIG. 1A is an embodiment of the pad 102 which is an under bump metallurgy (UBM) pad. The UBM pad 102 is a solderable surface. In some embodiments, the UBM pad 102 is an exposed part of the circuits of the carrier 103 and is disposed above a passivation layer 103c of the carrier 103. The UBM pad 102 serves as a platform for receiving a solder material and for connecting the circuits of the carrier 103. The UBM pad 102 attaches with the solder material after a heat treatment. The UBM pad 102 connects with a terminal 103b of the circuits of the carrier 103 through a conductive redistribution layer (RDL) 103d. The RDL 103d re-routes a path of the circuits from the terminals 103b to the UBM pad 102.

In some embodiments, the UBM pad 102 is a metallurgical layer or a metallurgical stack film above the passivation layer 103c. In some embodiments, the UBM pad 102 includes metal or metal alloy. The UBM pad 102 includes chromium (Cr), copper (Cu), gold (Au), titanium (Ti) or tungsten (W), etc. The UBM pad 102 is disposed by various manners, such as evaporation, sputtering or electroplating, etc.

Figure 2:
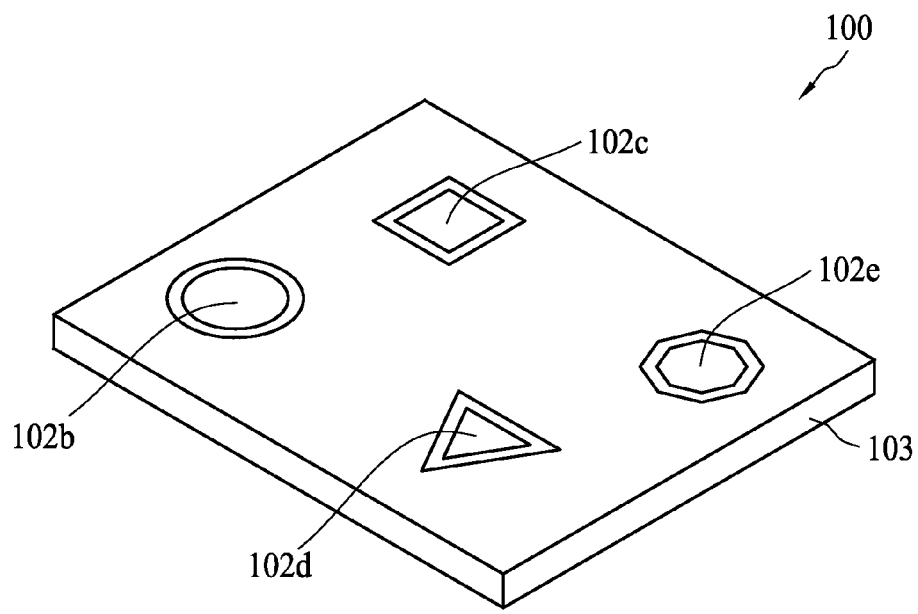
FIG. 2 is a schematic view of pads in various shapes in accordance with some embodiments of the present disclosure.

In some embodiments, the UBM pad 102 is in various shapes such as circular shape 102b, quadrilateral shape 102c, triangular shape 102d or polygonal shape 102e, etc., as in FIG. 2.

Figure 3:
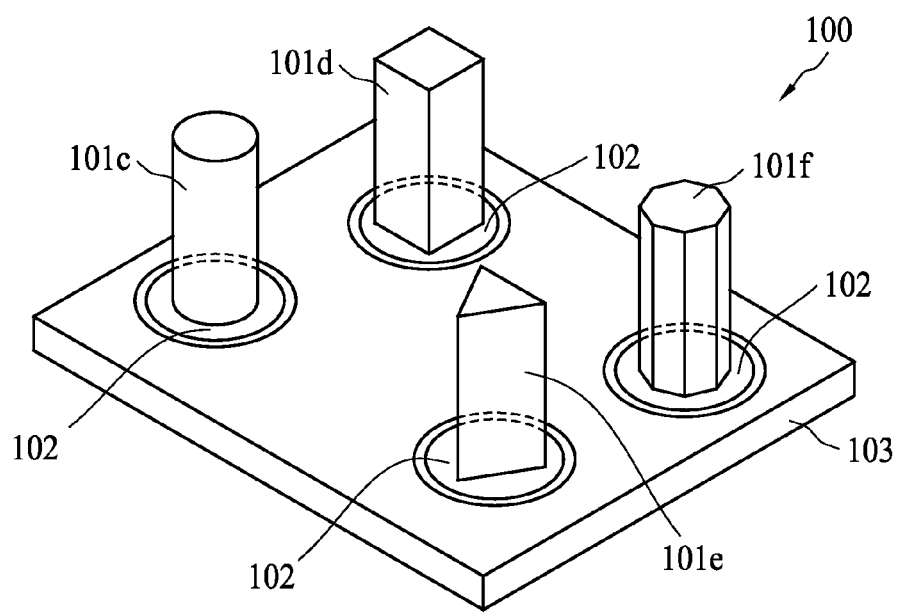
FIG. 3 is a schematic view of posts in various shapes in accordance with some embodiments of the present disclosure.

In some embodiments as in FIG. 1, the post 101 is protruded from the pad 102 in a cylindrical shape. The post 101 is substantially upright and supported by the pad 102. In some embodiments, the cylindrical post 101 is in various cross-sectional shapes such as circular shape 101c, quadrilateral shape 101d, triangular shape 101e or polygonal shape 101f, etc., as in FIG. 3. In addition, a wide variety of materials is selected for the post 101 such as metal or metal alloy. In some embodiments, the post 101 includes copper (Cu), gold (Au), platinum (Pt), titanium (Ti), nickel (Ni), aluminum (Al), etc.

Figure 4:
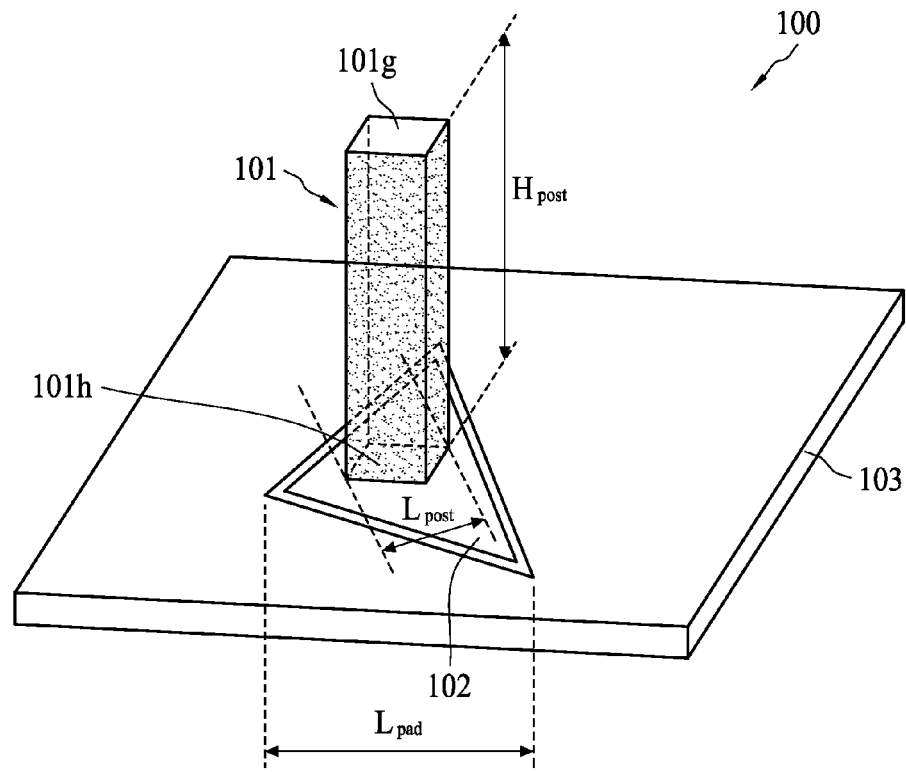
FIG. 4 is a schematic view of a cuboid post disposed on a polygonal pad in accordance with some embodiments of the present disclosure.
Figure 4A:
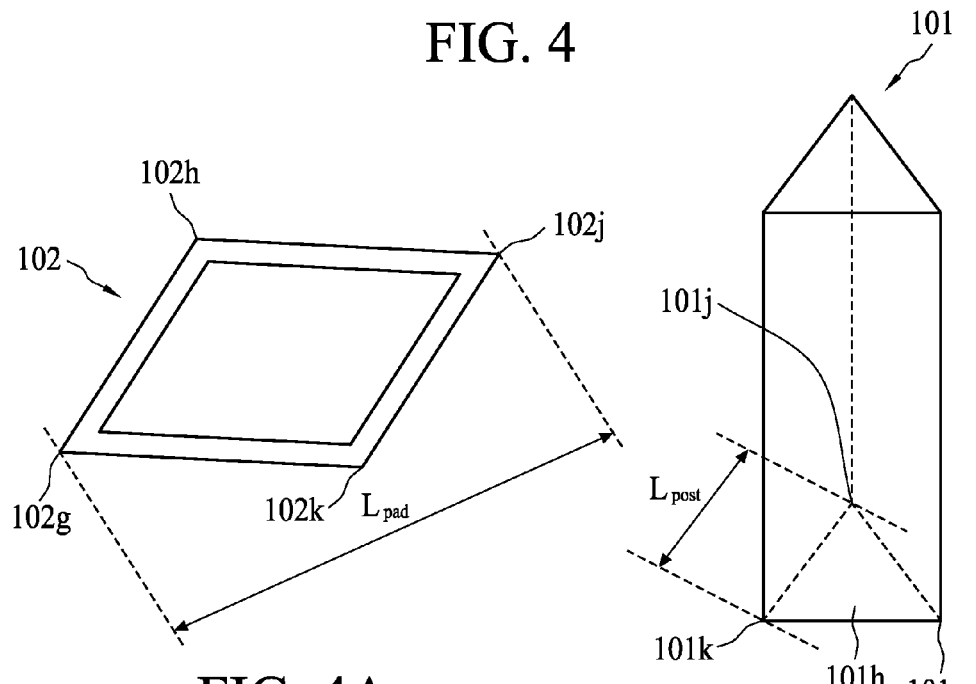
FIG. 4A is a schematic view of a quadrilateral pad in accordance with some embodiments of the present disclosure.

In some embodiments, there is a geometrical relationship between the post 101 and the pad 103. FIG. 4 is an embodiment of a semiconductor device 100 with a height $H_{post}$ of the post 101 in a ratio to a longest length $L_{pad}$ of a pad 102. The height $H_{post}$ of the post 101 is defined as a distance between a top surface 101g and a bottom surface 101h of the post 101. The top surface 101g and the bottom surface 101h are located at ends of the post 101 respectively and are opposite from each other. On the other hand, the longest length $L_{pad}$ of the pad 102 is defined as a distance between two corners which are furthest away from each other among all corners of the pad 102. For example, for a quadrilateral shape pad 102 as in FIG. 4A, the longest length $L_{pad}$ of the pad 102 is a longest diagonal of the pad 102 between two corners 102g, 102j. The distance between two corners 102g, 102j is the furthest away from each other among all four corners 102g, 102h, 102j, 102k of the pad 102. In some embodiments, the height $H_{post}$ of the post 101 to the longest length $L_{pad}$ of the pad 102 is between about 0.25 and about 0.7.

Figure 4B:
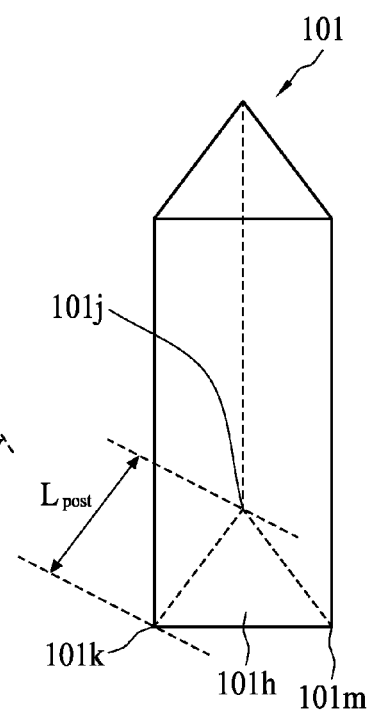
FIG. 4B is a schematic view of a prism post in accordance with some embodiments of the present disclosure.

In some embodiments, a longest length $L_{post}$ of an interface between the post 101 and the pad 102 is in a ratio to the longest length $L_{pad}$ of the pad 102. The interface is a bottom surface 101h of the post 101 contacting the pad 102. The longest length $L_{post}$ of the interface between the post 101 and the pad 102 is a distance between two corners of the pad 102 which are furthest away from each other among all corners of the pad 102. For example, for a prism post 101 as in FIG. 4B, the longest length $L_{post}$ of the interface between the prism post 101 and the pad 102 is the distance between two corners 101j, 101k. The distance between two corners 101j, 101k is furthest away from each other among all three corners 101j, 101k, 101m of the prism post 101. In some embodiments, the longest length $L_{post}$ of the interface between the post 101 and the pad 102 to the longest length $L_{pad}$ of the pad 102 is between about 0.2 and about 0.5.

Figure 5:
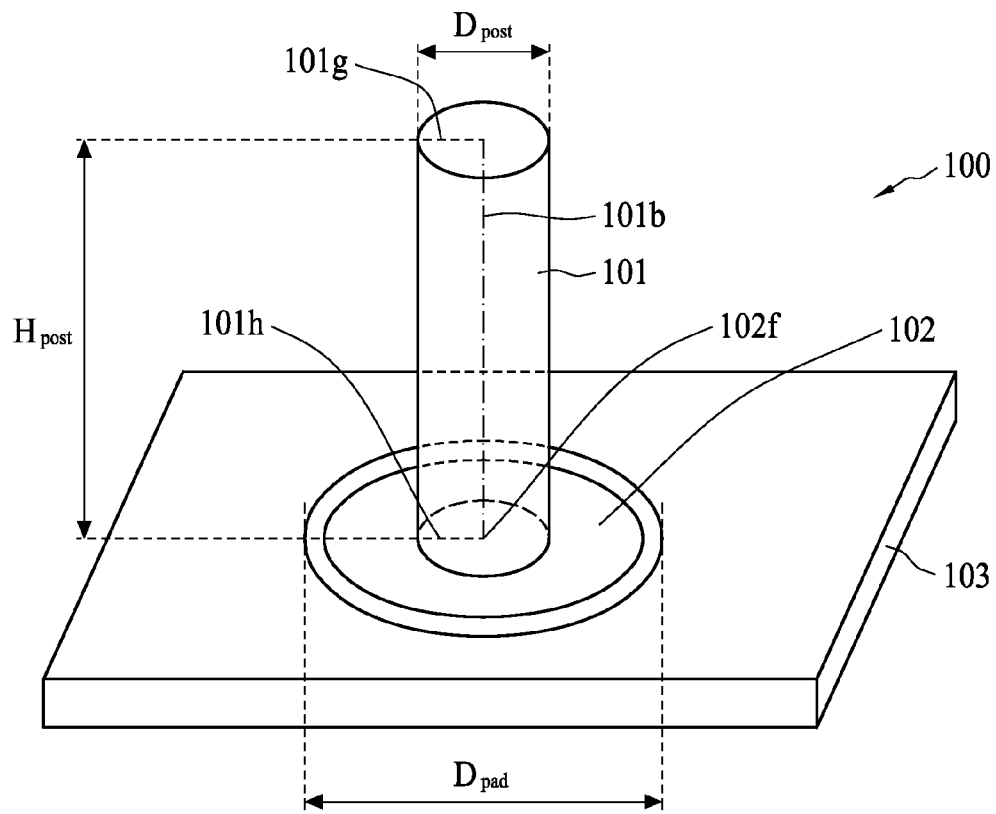
FIG. 5 is a schematic view of a cylindrical post disposed on a circular pad in accordance with some embodiments of the present disclosure.

FIG. 5 is an embodiment of a semiconductor device 100 having a cylindrical circular post 101 with a circular cross-sectional shape and a circular pad 102. A longest length $L_{pad}$ of the circular pad 102 is a diameter $D_{pad}$ of the circular pad 102. A height $H_{post}$ of the cylindrical post 101 to the diameter $D_{pad}$ of the circular pad 102 is between about 0.25 and about 0.7. In some embodiments, a longest length $L_{post}$ of the cylindrical post 101 is a diameter $D_{post}$ of the cylindrical post 101. The diameter $D_{post}$ of the cylindrical post 101 to the diameter $D_{pad}$ of the circular pad 102 is between about 0.2 and about 0.5. In some embodiments, the cylindrical post 101 is protruded from the circular pad 102 along an axis 101b of the cylindrical post 101b. The axis 101b intersects with a center 102f of the circular pad 102, thus the cylindrical post 101 and the circular pad 102 are in a T shape.

Figure 6:
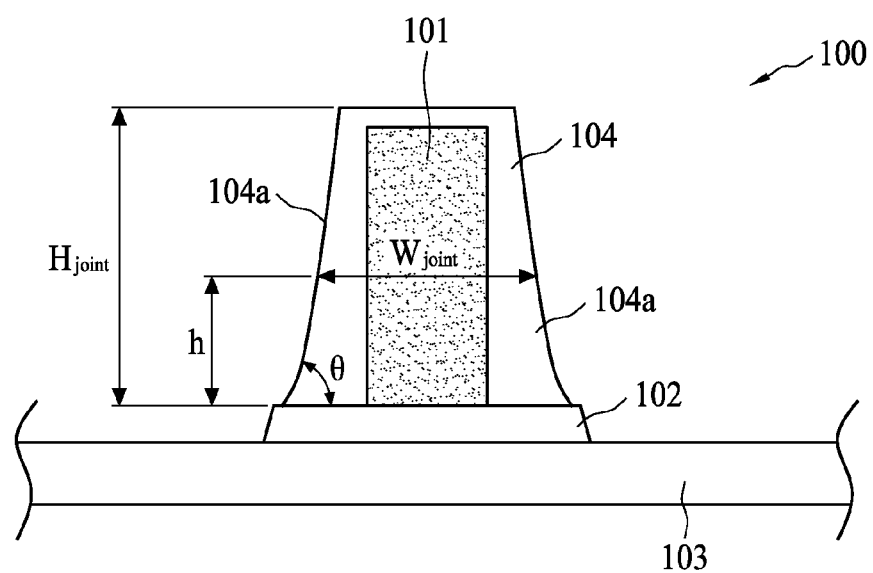
FIG. 6 is a schematic view of a semiconductor device having a joint adjacent to a post and a pad in accordance with some embodiments of the present disclosure.

FIG. 6 is an embodiment of a semiconductor device 100 including a joint 104 adjacent to a post 101. The joint 104 is configured to be an intermediate to connect a pad 102 of a carrier 103 with a pad of another carrier. The joint 104 is disposed over the post 101 and the pad 102 to surround the post 101. The joint 104 is disposed by various manners, such as by stencil or spraying, etc. A wide variety of materials is selected for the joint 104 such as metal or metal alloy. In some embodiments, the joint includes lead (Pb) or tin (Sn), etc. In some embodiments, the joint 104 includes a solder material as a solder joint which has a low eutectic point and good adhesion with the pad 102. In some embodiments, the joint 104 is a solder paste mixture of metallic powders and flux.

In some embodiments, the joint 104 has several profile features. The joint 104 has a wetting angle θ. The wetting angle θ is an angle between the pad 102 and an outer surface 104a of the joint 104 within the joint 104. The wetting angle θ is dependent on dimensions and shapes of the post 101 and the pad 102. In some embodiments, the wetting angle θ is dependent on heat treatment operations of the semiconductor device 100 subsequent to disposition of the joint 104. In some embodiments, the wetting angle θ is substantially less than 120 degree. In some embodiments, the wetting angle θ is substantially less than 110 degree. In some embodiments, the joint 104 is symmetrically disposed about the post 101, such that the wetting angle θ is substantially consistent between the pad 102 and the outer surface 104a of the joint 104. In some embodiments, the joint 104 is in a concave shape, and the outer surface 104a has a curvature towards the post 101 as in FIG. 6. The wetting angle θ varies correspondingly to the curvature of the outer surface 104a. For example, the wetting angle θ is smaller if the curvature of the outer surface 104a towards the post 101 is greater.

In some embodiments, another profile feature of the joint 104 in some embodiments is an aspect ratio. The aspect ratio of the joint 104 is defined as a ratio of a height $H_{joint}$ of the joint 104 and a width $W_{joint}$ of the joint 104. The width $W_{joint}$ of the joint 104 is at a half height h of the joint 104 (h=½ of $H_{joint}$). In some embodiments, the aspect ratio is X. That is, the height $H_{joint}$ of the joint 104 to the width $W_{joint}$ of the joint 104 at a half height h of the joint 104 is between about 0.4 and about 0.85. The width $W_{joint}$ of the joint 104 and the height $H_{joint}$ of the joint 104 vary correspondingly to the curvature of the joint 104. For example, the curvature of the joint 104 is greater when the width $W_{joint}$ of the joint 104 decreases and/or the height $H_{joint}$ of the joint 104 increases. The aspect ratio of the joint 104 vary correspondingly to the width $W_{joint}$ of the joint 104 and the height $H_{joint}$ of the joint 104. For example, the aspect ratio is greater if the height $H_{joint}$ of the joint 104 increases and the width $W_{joint}$ of the joint 104 decreases. The wetting angle θ varies correspondingly to the aspect ratio of the joint 104. For example, the wetting angle θ is smaller if the aspect ratio of the joint 104 is greater.

Figure 7:
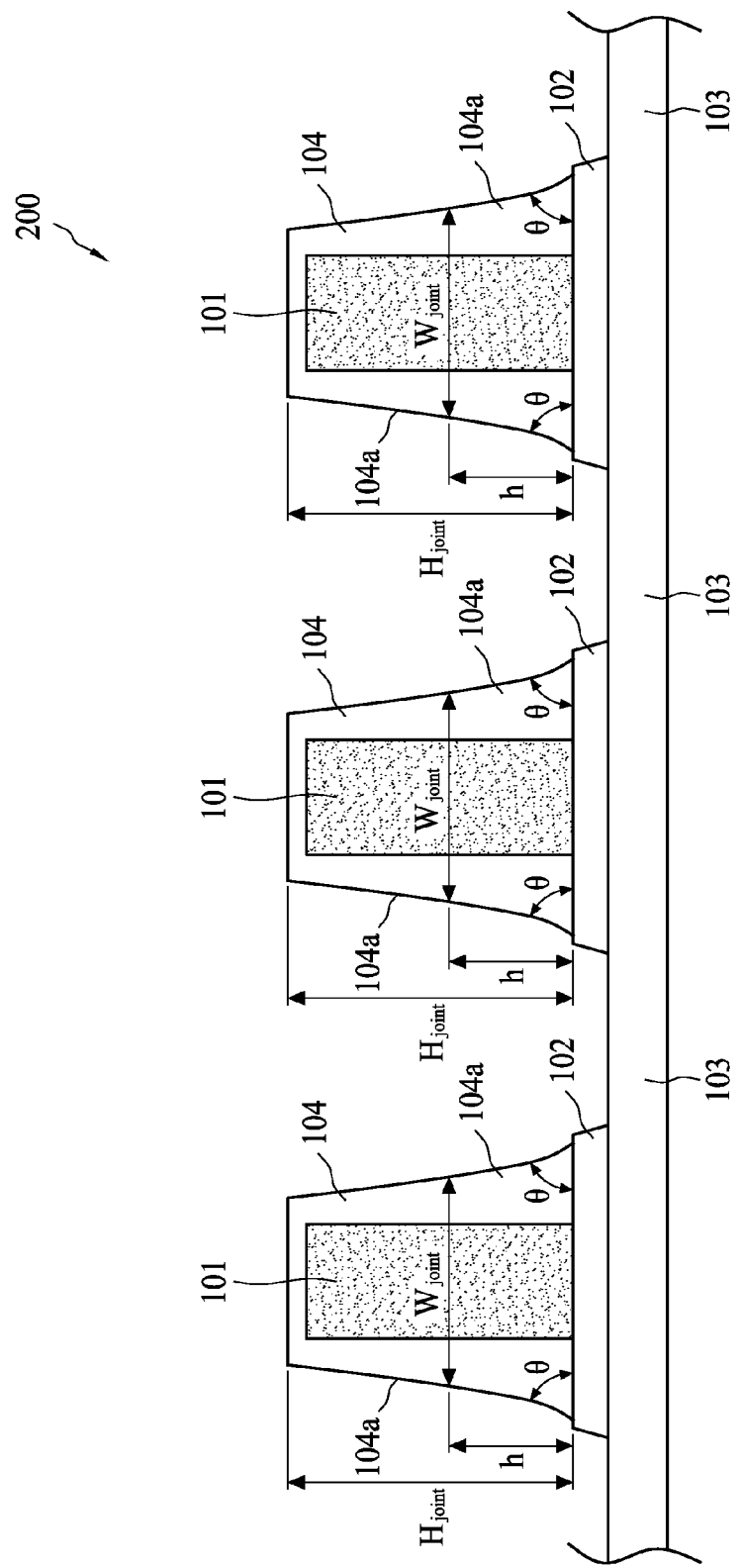
FIG. 7 is a schematic view of a semiconductor device having a number of posts and pads on a carrier in accordance with some embodiments of the present disclosure.

FIG. 7 is an embodiment of a semiconductor device 200 configured for mounting and connecting with another carrier. The semiconductor device 200 includes a number of pads 102 on a carrier 103, a number of posts 101 disposed on the pads 102 respectively, and a number of joints 104 surrounding the posts 101 respectively. Each post 101 is disposed on the corresponding pad 102 and is surrounded by a corresponding joint 104. In some embodiments as in FIG. 7, the pads 102 are substantially in same configuration and shapes. The posts 101 are substantially in same configuration and shapes. The height $H_{post}$ of the posts 101 are substantially the same. The joints 104 are substantially in same configuration and shapes. The aspect ratios of the height $H_{joint}$ of the joints 104 and the width $W_{joint}$ of the joints 104 at the half height h of the joints 104 are substantially the same. The wetting angles θ are substantially the same.

In some embodiments, an arrangement of the posts 101 and the pads 102 on the carrier 103 corresponds to a design of pads of another carrier configured for receiving the semiconductor device 200. In some embodiments, the pads 102 are in different shapes from each other. In some embodiments, the posts 101 are in different shapes from each other. In some embodiments, the wetting angles θ are different from each other, because the dimensions and shapes of the pads 102 and the posts 101 are different from each other.

Figure 8A:
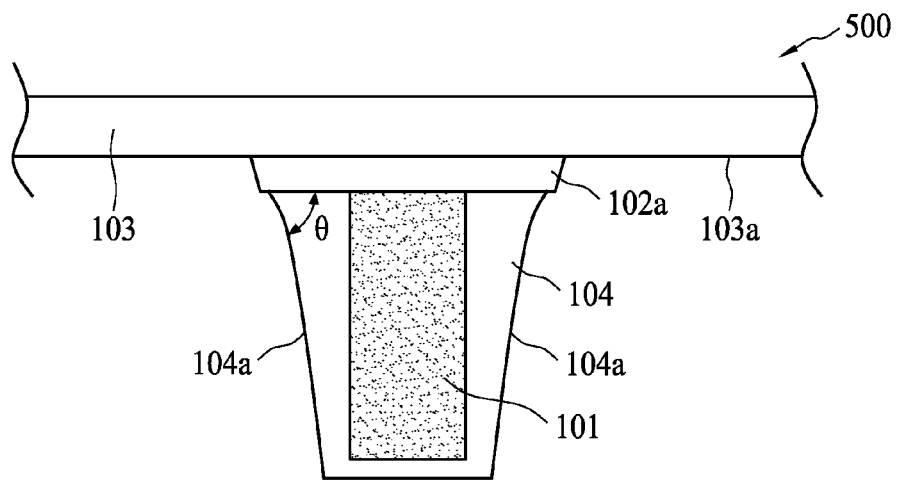
FIG. 8A is a schematic view of a semiconductor device including a first carrier configured for mounting on a second carrier in accordance with some embodiments of the present disclosure.

FIG. 8A is an embodiment of a semiconductor device 500 including a first carrier 103 and a second carrier 106. The first carrier 103 is configured for mounting on the second carrier 106. The first carrier 103 has a first pad 102a on a surface 103a of the first carrier 103. The first pad 102a is corresponding to the pad 102 with reference to the aforementioned embodiments. The first pad 102a has a post 101 disposed on the first pad 102a. The post 101 is surrounded and covered by a joint 104 over the first pad 102a. The joint 104 has a wetting angle θ between the first pad 102a and an outer 104a of the joint 104.

The second carrier 106 is configured for receiving the first carrier 103. In some embodiments, the second carrier 106 is a substrate or a printed circuit board (PCB) for carrying and supporting components and circuits. The second carrier 106 has a second pad 107 on a surface 106a of the second carrier 106. The second pad 107 is configured for receiving the joint 104. The second pad 107 is electrically conductive and designed to electrically communicate with circuits of the second carrier 106. In some embodiments, the second pad 107 is a bonding pad exposed on the surface 106a and connected with circuits running through the second carrier 106. The second pad 107 is plated with an electrically conductive metal such as gold, copper, etc.

Figure 8B:
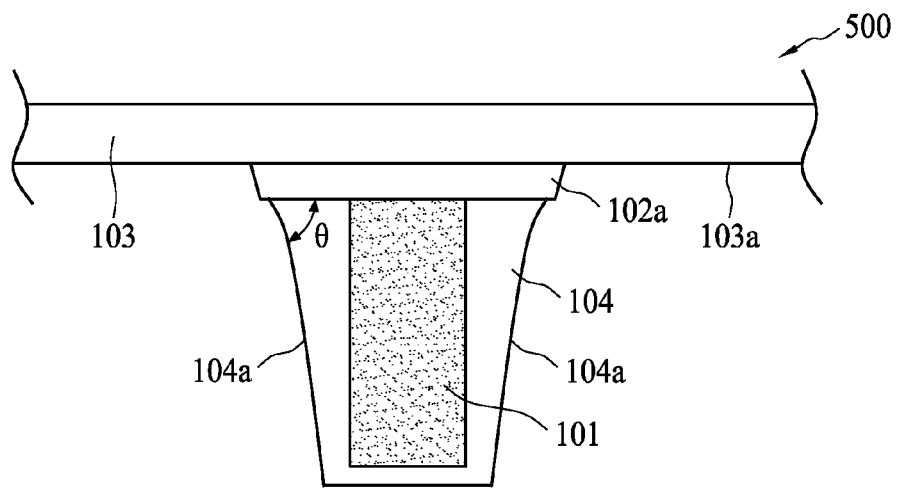
FIG. 8B is a schematic view of a semiconductor device including a first carrier configured for mounting on a second carrier disposed with a pre-soldering bump on a second pad of the second carrier in accordance with some embodiments of the present disclosure.

In some embodiments as in FIG. 8B, the second pad 107 has a pre-soldering bump 108 on the second pad 107. The pre-soldering bump 108 is disposed on the second pad 107 by electroplating and is configured for facilitating a connection between the first pad 102a and the second pad 107 by the joint 104. In some embodiments, the pre-soldering bump 108 includes metals such as lead, tin copper, gold, nickel, etc. or metal alloy such as combination of lead, tin copper, gold, nickel, etc.

Figure 9:
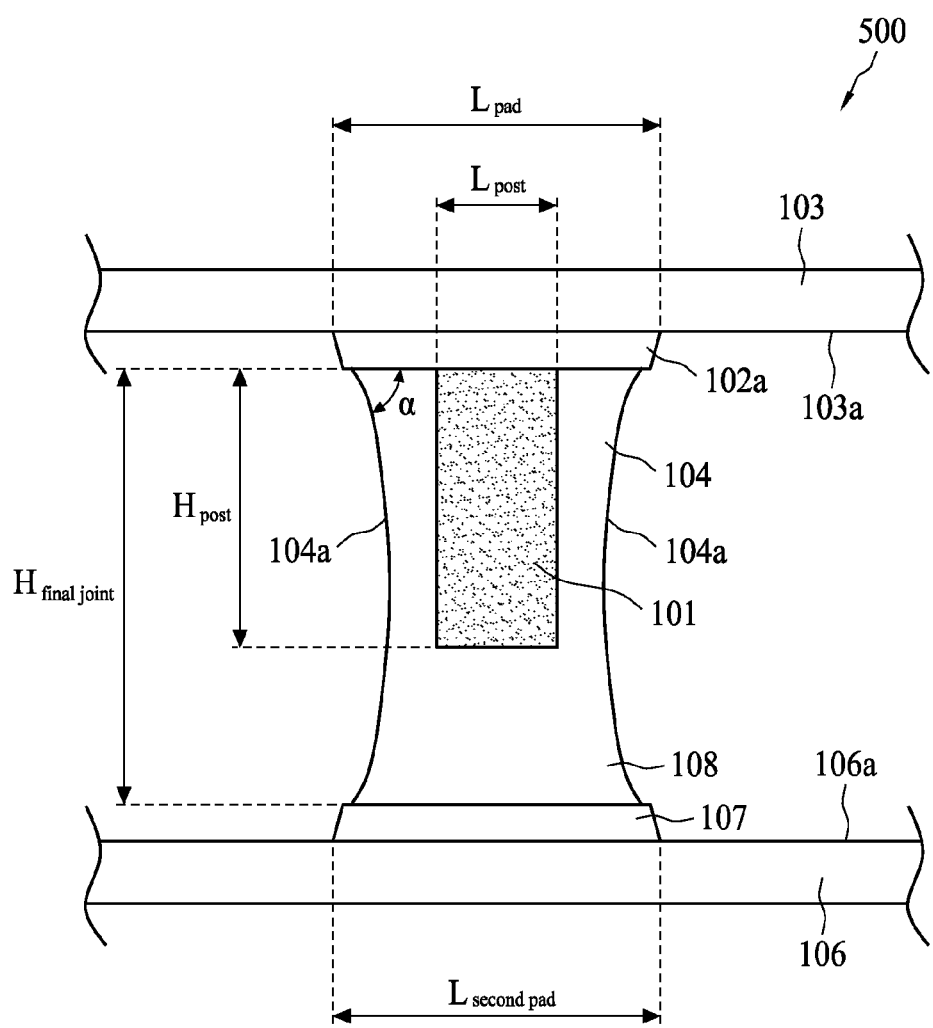
FIG. 9 is a schematic view of a semiconductor device including a first carrier on a second carrier and a post disposed on a first pad in accordance with some embodiments of the present disclosure.

FIG. 9 is an embodiment of a semiconductor 500 including a first carrier 103 mounted on a second carrier 106 by connecting a first pad 102a on the first carrier 103 with a second pad 107 on the second carrier through a joint 104. In some embodiments, the first pad 102a is connected with the second pad 107 by the joint 104 with facilitation of a pre-soldering bump disposing on the second pad 107. The joint 104 is disposed to surround a post 101 and connect the first pad 102a with the second pad 107.

In some embodiments as in FIG. 9, the joint 104 has a wetting angle α. The wetting angle α is defined as an angle between the first pad 102a and an outer surface 104a of the joint 104 within the joint 104. In some embodiments, the wetting angle α is less than 120 degree. The wetting angle α is dependent on a ratio between a longest length $L_{pad}$ of the first pad 102a and a longest length $L_{second\ pad}$ of the second pad 107. The wetting angle α is between about 60 degree and about 120 degree. The longest length $L_{pad}$ of the first pad 102a to the longest length $L_{second\ pad}$ of the second pad 107 is between about 0.75 and about 1.1. The longest length $L_{second\ pad}$ is defined as a distance between two corners of the second pad 107. The two corners are the furthest away from each other among all corners of the second pad 107. In some embodiments, the wetting angle α is also dependent on a ratio between a height $H_{post}$ of the post 101 and a height $H_{final\ joint}$ of the joint 104. The height $H_{final\ joint}$ of the joint 104 is defined as a shortest distance between the first pad 102a and the second pad 107. In some embodiments, the height $H_{post}$ of the post 101 is equal to and/or greater than about ⅓ of the height $H_{final\ joint}$ of the joint 104. In some embodiments, the height $H_{final\ joint}$ of the joint 104 to the longest length $L_{pad}$ of the first pad 102a is between about 0.4 and about 0.95. In some embodiments, the height $H_{final\ joint}$ of the joint 104 to the longest length $L_{second\ pad}$ of the second pad 107 is between about 0.4 and about 0.95. In some embodiments, the height $H_{post}$ of the post 101 to the longest length $L_{second\ pad}$ of the second pad 107 is between about 0.25 and about 0.7.

In the present disclosure, a method of manufacturing a semiconductor device is also disclosed. In some embodiments, a semiconductor device is formed by a method 600. The method 600 includes a number of operations and the description and illustration are not deemed as a limitation as the sequence of the operations. The semiconductor device is provided and configured for forming a wafer level chip scale semiconductor package.

Figure 10:
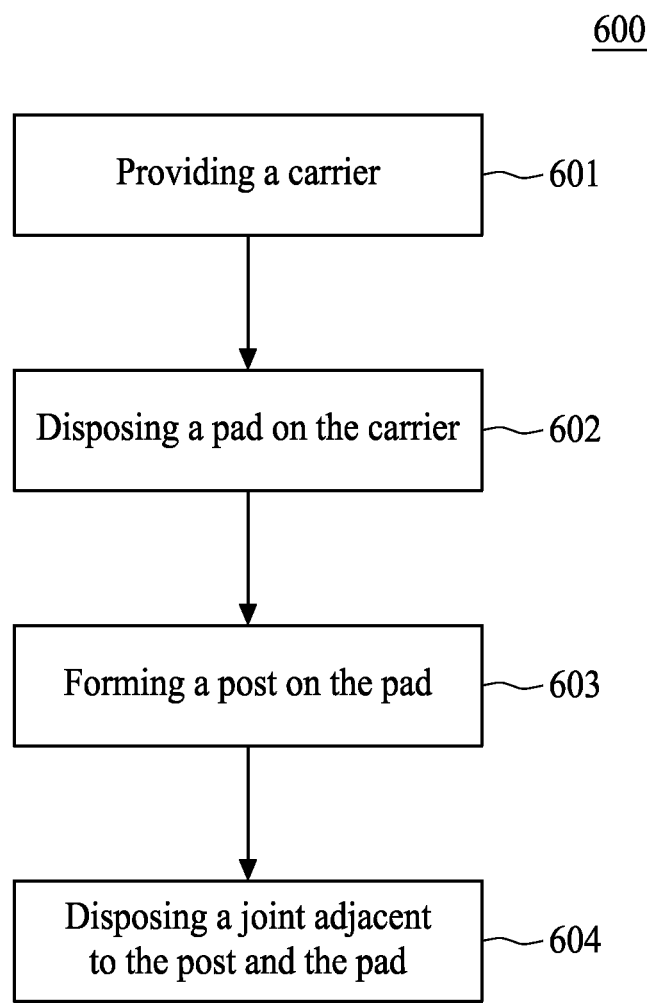
FIG. 10 is a flow diagram of a method of manufacturing a semiconductor device in accordance with some embodiments of the present disclosure.

FIG. 10 is an embodiment of a method 600 of manufacturing a semiconductor device. The method 600 includes operations 601, 602, 603, 604. In the operation 601, a carrier is provided. In some embodiments, the carrier is a silicon wafer which includes a number of layers for carrying components and integrated circuits (IC) within the layers. The silicon wafer is produced from crystal form of silicon through numbers of operations such as fabrication, etching or photolithography, etc.

In the operation 602, a pad is disposed and attached on the carrier. The pad is arranged in various manners and patterns. In some embodiments, the pad is formed on a surface of the carrier. In some embodiments, the pad is formed as a under bump metallurgy (UBM) pad. The UBM pad is produced by a number of operations 602a, 602b, 602c as in FIG. 11.

Figure 11:
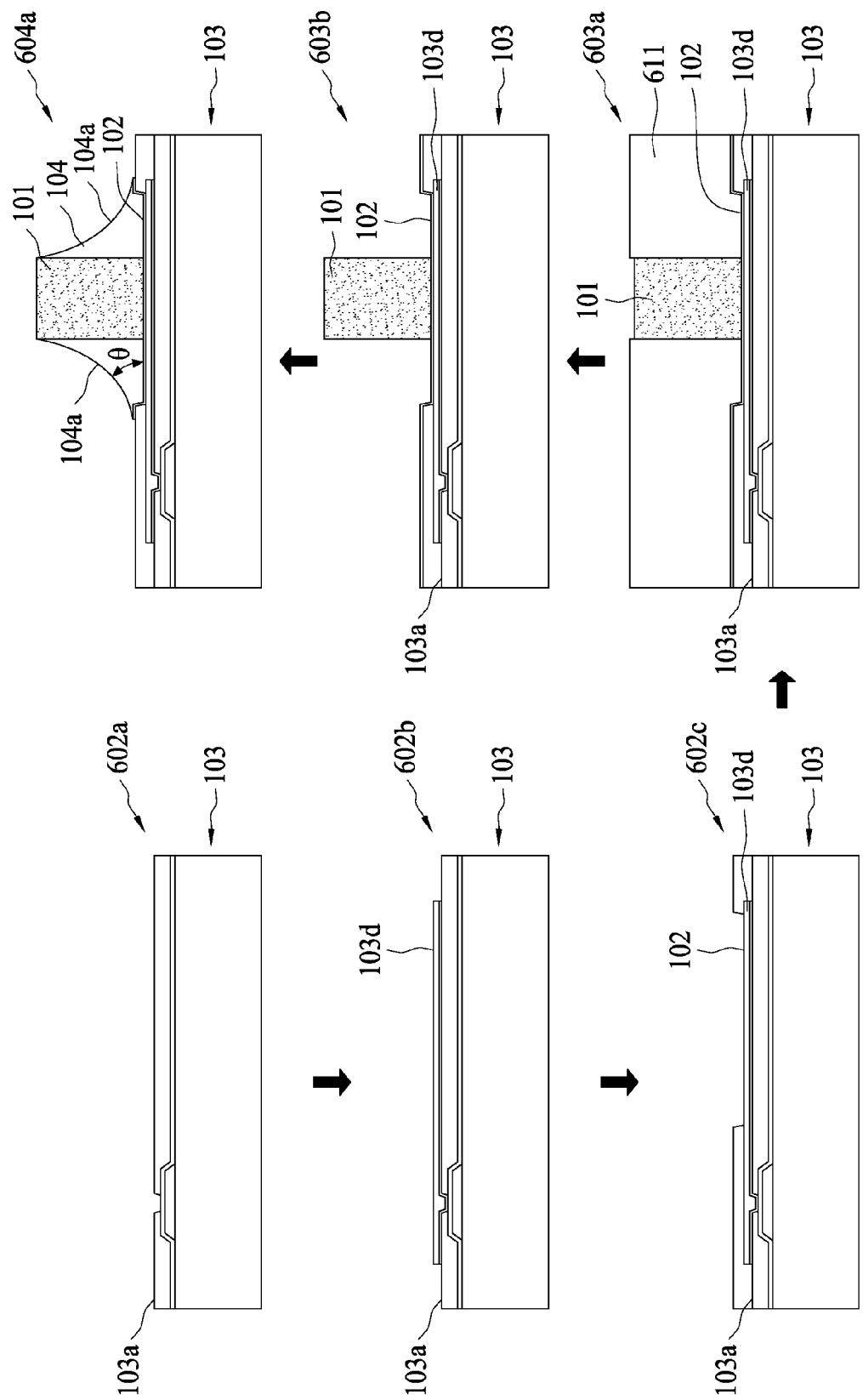
FIG. 11 is a method of manufacturing a semiconductor device in accordance with some embodiments of the present disclosure.

In the operation 602a as in FIG. 11, a terminal 103b is formed within the carrier 103. The terminal is formed within a covering layer including a dielectric material such as polybenzoxazole (PBO). A part of the terminal 103b is exposed on a surface 103a of the carrier 103.

In the operation 602b as in FIG. 11, a redistribution layer (RDL) 103d is formed over the terminal 103b after the formation of the terminal 103b. The exposed part of the terminal 103b is connected with the RDL 103d. In some embodiments, the RDL 103d includes a seed layer and a metal layer which are disposed in a sequence. The RDL 103d is formed to connect the terminal 103b with the UBM pad 102.

In the operation 602c as in FIG. 11, the UBM pad 102 is formed over the RDL 103d. The UBM pad 102 is formed by various manners such as sputtering or electroplating, etc. The UBM pad 102 is configured for receiving a post 101.

In the operation 603 as in FIG. 10, a post is formed on a pad. In some embodiments, the operation 603 includes operations 603a, 603b as in FIG. 11. The post 101 is produced by adding a metal such as copper between a hole of a photoresist film 611 during the operation 603a, and then stripping out the photoresist film 611 during the operation 603b. The post 101 is formed and attached on the pad 102.

In the operation 604 as in FIG. 10, a joint is disposed adjacent to a post and a pad. In some embodiments, the operation 604 includes operations 604a as in FIG. 11. The joint 104 is disposed adjacent to a post 101 and a pad 102. The joint 104 is disposed and formed around the post 101. The joint 104 includes a soldering material spraying over the pad 102 and the post 101. In some embodiments, the joint 104 is formed by pasting the soldering material over a stencil. In some embodiments, the joint 104 is formed as a solder joint. In some embodiments, the joint 104 has a curvature of the outer surface 104a of the joint 104 towards the post 101. The joint 104 is formed in a concave shape by the curvature. In some embodiments, the curvature of the joint 104 forms a wetting angle θ between an outer surface 104a of the joint 104 and the pad 102 within the joint 104. In some embodiments, the wetting angle θ is formed substantially less than 120 degree.

Figure 12:
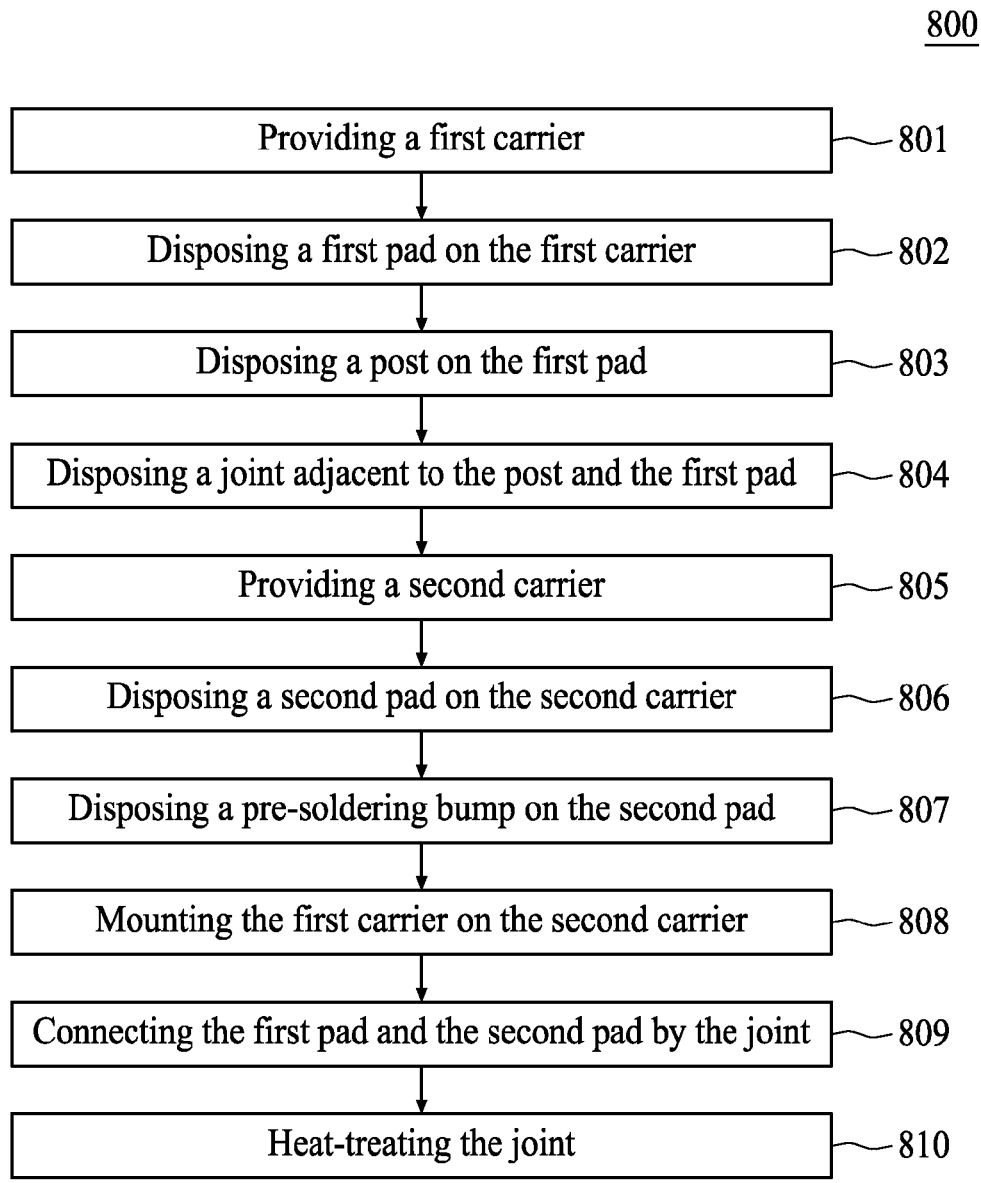
FIG. 12 is a flow diagram of a method of manufacturing a semiconductor device including a first carrier and a second carrier in accordance with some embodiments of the present disclosure.
Figure 13:
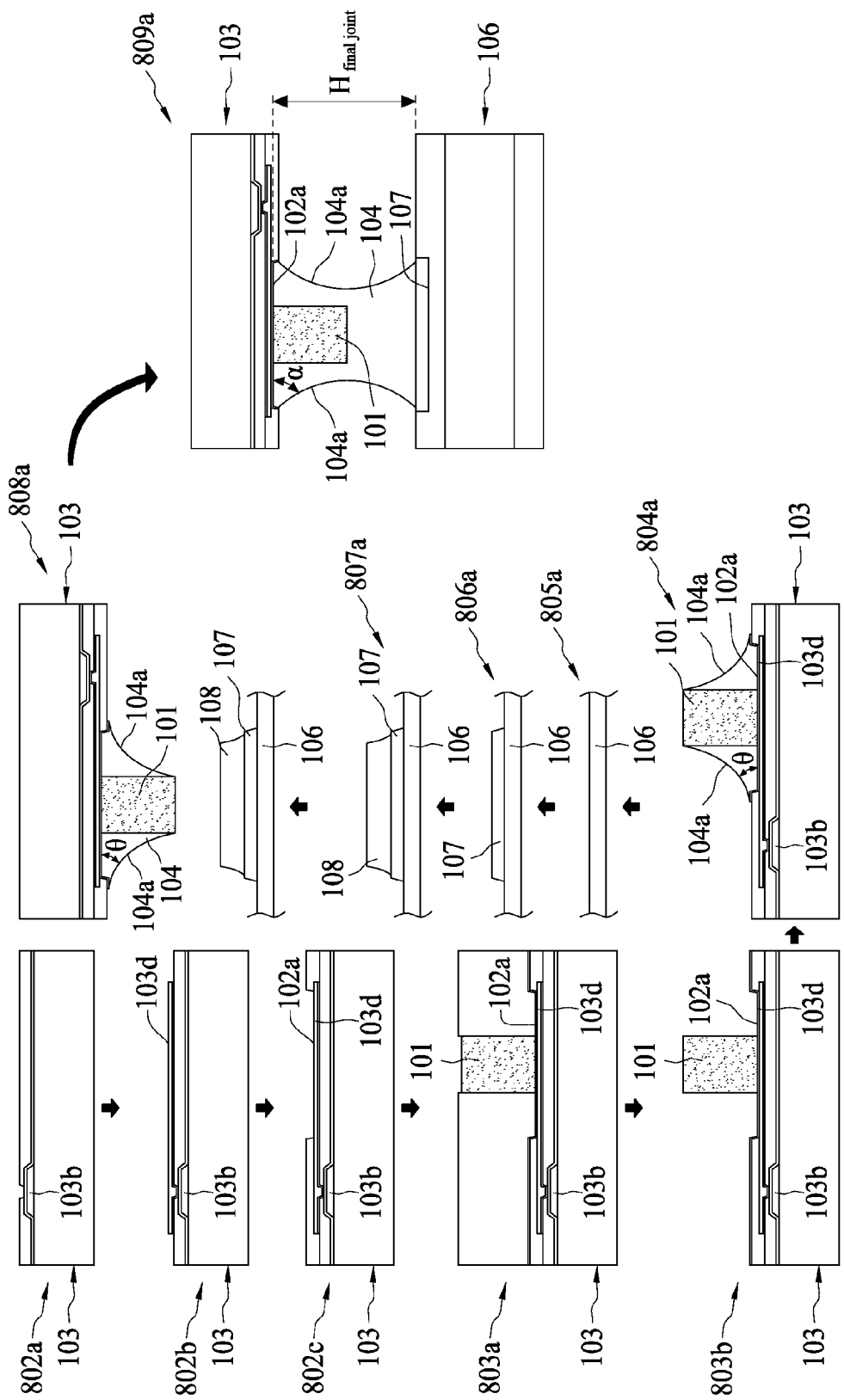
FIG. 13 is a method of manufacturing a semiconductor device including a first carrier and a second carrier in accordance with some embodiments of the present disclosure.

FIG. 12 is an embodiment of operations of a method 800 of manufacturing a semiconductor device. The method 800 includes operations 801, 802, 803, 804, 805, 806, 807, 808, 809, 810. The operations 801, 802, 803, 804 correspond to the operations 601, 602, 603, 604 with reference to FIG. 10 respectively. The operation 802 includes the operations 802a, 802b, 802c as in FIG. 13 which correspond to the operations 602a, 602b, 602c with reference to FIG. 11. The operation 803 includes the operations 803a, 803b as in FIG. 13 which correspond to the operations 603a, 603b with reference to FIG. 11. The operation 804 includes the operation 804a as in FIG. 13 which corresponds to the operation 604a with reference to FIG. 11.

In the operation 805, a second carrier is provided. The operation 805 includes an operation 805a as in FIG. 13. The second carrier 106 is provided. The second carrier 106 is configured for receiving a first carrier 103. The second carrier 106 is provided as a substrate or a printed circuit board (PCB) carrying and supporting components or circuits.

In the operation 806, a second pad is disposed on the second carrier. The operation 806 includes an operation 806a as in FIG. 13. The second pad 107 is disposed on the second carrier 106. The second pad 107 is formed on a surface of the second carrier 106 to connect circuits running through the second carrier 106.

In the operation 807, a pre-soldering bump is disposed on the second pad. The operation 807 includes an operation 807a as in FIG. 13. The pre-soldering bump 108 is disposed on the second pad 107. The pre-soldering bump 108 is formed on the second pad 107 by electroplating and is configured for facilitating a connection between the first pad 102a with the second pad 107.

In the operation 808, a first carrier is mounted on the second carrier. The operation 808 includes an operation 808a as in FIG. 13. The first carrier 103 is mounted on the second carrier 106.

In the operation 809, a first pad is connected with the second pad by a joint and a pre-soldering bump. The operation 809 includes an operation 809a as in FIG. 13. The first pad 102a is connected with the second pad 107 by a joint 104 and a pre-soldering bump 108. The first carrier 103 is mounted above the second carrier 106 and is attached with the second carrier 106 by connecting the first pad 102a and the second pad 107 through the joint 104 and the pre-soldering bump 108. The joint 104 is contacted with the pre-soldering bump 108 then the joint 104 and the pre-soldering bump 108 integrally form the solder joint 104. In some embodiments as in FIG. 13, the joint 104 is formed to have some profile features. A wetting angle α between an outer surface 104a of the solder joint 104 and the first pad 102a within the solder joint 104 is formed. In some embodiments, the wetting angle α is formed smaller than 120 degree. In some embodiments, a height $H_{final\,joint}$ of the joint 104 is formed after the operation 810. In some embodiments, the height $H_{post}$ of the post 101 is equal to and/or greater than about ⅓ of the height $H_{final\,joint}$ of the joint 104.

In an operation 810, the joint is heat treated. The joint connects the first pad with the second pad after a heat treatment. There are a number of methods for heat treating the joint, such as infrared reflow or vapor phase reflow, etc. The heat treatment is implemented after mounting the first carrier on the second carrier through the joint, so that the first carrier is firmly mounted on the second carrier.

In some embodiments, a semiconductor device includes a carrier, an under bump metallurgy (UBM) pad on the carrier, and a post on a surface of the UBM pad. In some embodiments, a height of the post to a longest length of the UBM pad is between about 0.25 and about 0.7.

In some embodiments, a semiconductor device includes a first carrier, a first UBM pad on the first carrier, a post over the first UBM pad and a joint adjacent to the post. In some embodiments, a semiconductor device includes a wetting angle between a surface of the joint and the first UBM pad which is substantially less than 120 degree. In some embodiments, a semiconductor devices includes a second carrier and a second UBM pad on the second carrier. The first UBM pad is bonded with the second UBM pad by the joint. In some embodiments, a height of the post is equal to and/or greater than about ⅓ of a height of the joint between the first UBM pad and the second UBM pad.

In some embodiments, a method of manufacturing a semiconductor device includes providing a carrier, disposing a UBM pad on the carrier and forming a post on the UBM pad. In some embodiments, the method includes disposing a joint over the post and the UBM pad. In some embodiments, the method includes providing a second carrier and disposing a second UBM pad on the second carrier, and disposing a joint between the first UBM pad and the second UBM pad to bond the first UBM pad with the second UBM pad.

The methods and features of this invention have been sufficiently described in the above examples and descriptions. It should be understood that any modifications or changes without departing from the spirit of the invention are intended to be covered in the protection scope of the invention.

Moreover, the scope of the present application in not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein maybe utilized according to the present disclosure.

Accordingly, the appended claims are intended to include within their scope such as processes, machines, manufacture, compositions of matter, means, methods or steps. In addition, each claim constitutes a separate embodiment, and the combination of various claims and embodiments are within the scope of the invention.

What is claimed is:

1. A semiconductor device, comprising:
    a silicon substrate;
    a printed circuit board (PCB);
    a first pad on the silicon substrate;
    a second pad on the PCB;
    a post on a surface of the first pad, wherein the post consists of a metal or a metal alloy;
    a joint disposed between the silicon substrate and the PCB, contacted with the first pad and the second pad, and encapsulating the post;
    a first entire contact interface between the first pad and the joint;
    a second entire contact interface between the first pad and the post; and
    a third entire contact interface between the joint and the second pad, wherein an outer surface of the joint is concave and curved towards the post, and a height of the post is greater than or equal to ⅓ of a height of the joint between the first pad and the second pad, the first entire contact interface, the second entire contact interface and the third entire contact interface are flat surfaces, wherein a distance between the first entire contact interface and the third entire contact interface is equal to a distance between the second entire contact interface and the third entire contact interface, the second entire contact interface is a continuous surface.

2. The semiconductor device of claim 1, wherein a height of the post to a longest length of the first pad is between 0.25 and 0.7.

3. The semiconductor device of claim 1, wherein the diameter of the first pad to a diameter of the second pad is between 0.75 and 1.1.

4. The semiconductor device of claim 1, wherein the post has a cylindrical shape.

5. The semiconductor device of claim 1, wherein the second entire contact interface between the post and the first pad has a polygonal shape.

6. The semiconductor device of claim 1, wherein the second entire contact interface between the post and the first pad has a circular or quadrilateral shape.

7. The semiconductor device of claim 1, wherein the post includes copper (Cu).

8. The semiconductor device of claim 1, wherein the post is protruded from the first pad.

9. The semiconductor device of claim 1, wherein the post is substantially upright on the first pad.

10. The semiconductor device of claim 1, wherein the post and the first pad are in a T-shape.

11. The semiconductor device of claim 1, wherein the first pad includes copper (Cu), gold (Au), chromium (Cr), titanium (Ti) or tungsten (W).

12. The semiconductor device of claim 1, wherein an axis of the post intersects with a center of the first pad.

13. The semiconductor device of claim 1, wherein a wetting angle between the outer surface of the joint and the first pad or the second pad is less than 110 degree.

14. A semiconductor device, comprising:
    a silicon substrate including a first pad;
    a PCB including a second pad disposed opposite to the first pad;
    a post coupled with and standing on the first pad, wherein the post consists of a metal or a metal alloy;
    a joint encapsulating the post and bonding the first pad with the second pad;
    a first entire contact interface between the first pad and the joint;
    a second entire contact interface between the first pad and the post; and
    a third entire contact interface between the joint and the second pad, wherein an outer surface of the joint is concave and curved towards the post, and a height of the post is greater than or equal to ⅓ of a distance between the first pad and the second pad, the first entire contact interface, the second entire contact interface and the third entire contact interface are flat surfaces, wherein a distance between the first entire contact interface and the third entire contact interface is equal to a distance between the second entire contact interface and the third entire contact interface, the second entire contact interface is a continuous surface.

15. The semiconductor device of claim 14, wherein a wetting angle between the outer surface of the joint and the first pad or the second pad is less than 120 degree.

16. The semiconductor device of claim 14, wherein the joint includes a solder material.

17. The semiconductor device of claim 14, wherein a height of the joint over the post and the first pad to a width of the joint at a half height of the joint is between 0.4 and 0.85.

18. The semiconductor device of claim 14, wherein a ratio between a diameter of the post and a diameter of the first pad is between 0.2 and 0.5.

19. The semiconductor device of claim 18, wherein a ratio between the diameter of the first pad and a diameter of the second pad is 1:1.1.

20. The semiconductor device of claim 14, further comprising a pre-soldering bump disposed on the second pad.

* * * * *